United States Patent
Fukuyama et al.

(10) Patent No.: US 7,256,118 B2
(45) Date of Patent: Aug. 14, 2007

(54) SEMICONDUCTOR DEVICE USING LOW-K MATERIAL AS INTERLAYER INSULATING FILM AND ITS MANUFACTURE METHOD

(75) Inventors: Shun-ichi Fukuyama, Kawasaki (JP); Tamotsu Owada, Kawasaki (JP); Ken Sugimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/179,550

(22) Filed: Jul. 13, 2005

(65) Prior Publication Data

US 2005/0250309 A1   Nov. 10, 2005

Related U.S. Application Data

(62) Division of application No. 10/630,716, filed on Jul. 31, 2003, now Pat. No. 6,943,431.

(30) Foreign Application Priority Data

Aug. 2, 2002   (JP) .............................. 2002-226240

(51) Int. Cl.
*H01L 21/4763* (2006.01)
*H01L 21/3205* (2006.01)

(52) U.S. Cl. ..................... 438/618; 438/623; 438/637; 438/586

(58) Field of Classification Search ............... 438/618, 438/771, 624, 586, 623
See application file for complete search history.

(56) References Cited

U.S. PATENT DOCUMENTS 5,482,894 A   1/1996   Havemann

| 5,565,384 | A | 10/1996 | Havemann |
| 6,534,389 | B1 | 3/2003 | Ference et al. |
| 6,800,889 | B2 * | 10/2004 | Takatani et al. ............. 257/295 |
| 6,838,771 | B2 * | 1/2005 | Tanaka et al. ............... 257/758 |
| 2001/0009805 | A1 | 7/2001 | Ha et al. |
| 2002/0001973 | A1 | 1/2002 | Wu et al. |

(Continued)

FOREIGN PATENT DOCUMENTS

JP   10-144673   5/1998

(Continued)

OTHER PUBLICATIONS

K. Azuma et al., Semiconductor Device and Method of Manufacturing the Same, English Translation of JP 2001-274239 A, JPO, Oct. 2001.

(Continued)

*Primary Examiner*—Chuong A. Luu
(74) *Attorney, Agent, or Firm*—Westerman, Hattori, Daniels & Adrian, LLP.

(57) ABSTRACT

A semiconductor element is formed over a surface of a semiconductor substrate. A first insulating film is formed over the surface of the semiconductor substrate, the first insulating film covering the semiconductor element. A second insulating film is formed over the first insulating film, the second insulating film having a dielectric constant lower than that of the first insulating film. A first wiring pattern is formed over the second insulating film. A conductive connection member buried in the second and first insulating films electrically interconnects the first wiring pattern and semiconductor element.

6 Claims, 4 Drawing Sheets

U.S. PATENT DOCUMENTS

2002/0125577 A1    9/2002  Komada
2004/0023515 A1    2/2004  Gracias et al.

FOREIGN PATENT DOCUMENTS

| | | |
|---|---|---|
| JP | 2000-174137 | 6/2000 |
| JP | 2000-188331 | 7/2000 |
| JP | 2001-230316 | 8/2001 |
| JP | 2001-274239 | 10/2001 |
| JP | 2002-134609 | 5/2002 |
| JP | 2002-134610 | 5/2002 |
| JP | 2003-282703 | 10/2003 |
| JP | 2004-31918 | 1/2004 |

OTHER PUBLICATIONS

Stanley Wolf and Richard N. Tauber, "Silicon Processing for the VLSI Era—vol. 1: Process Technology," Lattice Press, Sunset Beach, California (1986), pp. 182-185.

Office Action from the Japanese Patent Office in the corresponding Japanese patent application dated Aug. 1, 2006.

\* cited by examiner

SEMICONDUCTOR DEVICE USING LOW-K MATERIAL AS INTERLAYER INSULATING FILM AND ITS MANUFACTURE METHOD

CROSS REFERENCE TO RELATED APPLICATION

This application is a divisional of prior application Ser. No. 10/630,716, filed on Jul. 31, 2003 now U.S. Pat. No. 6,943,431.

This application is based on Japanese Patent Application No. 2002-226240 filed on Aug. 2, 2002, the entire contents of which are incorporated herein by reference.

BACKGROUND OF THE INVENTION

A) Field of the Invention

The present invention relates to a semiconductor device and its manufacture method, and more particularly to a semiconductor device having an interlayer insulating film made of insulating material having a dielectric constant lower than silicon oxide film, and to its manufacture method.

B) Description of the Related Art

FIG. 4 is a cross sectional view of a semiconductor device having a conventional multilevel wiring structure. Active regions are defined by an element separation insulating film 101 formed on the surface of a silicon substrate 100. A MOSFET 102 is formed in and above the active region, having a source region 102S, a drain region 102D and a gate electrode 102G.

Covering MOSFET 102, a via layer insulating film 103 made of a phosphorous silicate glass (PSG) is formed on the silicon substrate 100. The via layer insulating film 103 is formed by depositing a PSG film having a thickness of 1.5 µm by chemical vapor deposition (CVD) at a substrate temperature of 600° C. and thereafter planarizing the surface of the PSG film by chemical mechanical polishing (CMP).

On the via contact layer insulating film (via layer insulating film) 103, a protective film 104 is formed having a thickness of 50 nm and made of silicon nitride. A via hole 105 is formed extending through the protective film 104 and via layer insulating film 103 and reaching the surface of the drain region 102D. The bottom and inner wall of the via hole are covered with a barrier metal layer 107 of TiN or the like, and a tungsten (W) plug 106 is filled in the via hole 105.

On the protective film 104, a wiring layer insulating film 110 made of porous silica and having a thickness of 150 nm and a cap film 111 made of silicon oxide and having a thickness of 100 nm are formed in this order. A wiring trench 112 is formed through the two films, the wiring layer insulating film 110 and cap film 111. The bottom and inner wall of the wiring trench 112 are covered with a barrier metal layer 113 made of TaN. A first-layer copper wiring pattern 114 is filled in the wiring trench 112.

An etching stopper film 120 of silicon nitride having a thickness of 50 nm, a via layer insulating film 121 of porous silica having a thickness of 250 nm, an etching stopper film 122 of silicon nitride having a thickness of 50 nm, a wiring layer insulating film 123 of porous silica having a thickness of 150 nm and a cap film 124 of silicon oxide having a thickness of 100 nm are stacked in this order on the cap film 111 and copper wiring pattern 114.

A wiring trench 128 is formed extending from the upper surface of the cap film 124 to the bottom of the wiring layer insulating film 123, and a via hole 127 is formed extending from the bottom of the wiring trench 128 to the upper surface of the lower-level wiring pattern 114. The bottoms and inner walls of the via hole 127 and wiring trench 128 are covered with a barrier metal layer 129 of TaN. A second-layer copper wiring pattern 130 is buried in the via hole 127 and wiring trench 128.

In this conventional multilevel wiring structure shown in FIG. 4, the first-layer wiring insulating film 110, second-layer via layer insulating film 121 and wiring layer insulating film 123 are made of porous silica having a low dielectric constant. Parasitic capacitance between wiring patterns can therefore be reduced.

With this multilevel wiring structure shown in FIG. 4, however, the first-layer via layer insulating film 103 disposed between the first-layer wiring pattern 114 and silicon substrate 100 is made of PSG. The first-layer via layer insulating film 103 is not made of low dielectric constant material such as porous silica, because of preventing the electric characteristics of MOSFET 102 from being varied.

Since the first-layer via layer insulating film 103 is not made of low dielectric constant material, parasitic capacitance between the first-layer wiring pattern 114 and the conductive region formed in the surface layer of the silicon substrate 100 cannot be reduced. An electric field generated between wiring lines formed in the first-layer wiring layer insulating film 110 propagates in the underlying via layer insulating film 103. Therefore, the parasitic capacitance cannot be reduced although the via layer insulating film 110 is made of porous silica.

SUMMARY OF THE INVENTION

An object of this invention is to provide a semiconductor device capable of enhancing the effects of reducing parasitic capacitance associated with a first-layer wiring pattern.

According to one aspect of the present invention, there is provided a semiconductor device comprising: a semiconductor element formed over a surface of a semiconductor substrate; a first insulating film formed over the surface of the semiconductor substrate, the first insulating film covering the semiconductor element; a second insulating film formed over the first insulating film, the second insulating film having a dielectric constant lower than a dielectric constant of the first insulating film; a first wiring pattern formed over the second insulating film; and a conductive connection member buried in the second and first insulating films, the conductive connection member electrically interconnecting the first wiring pattern and the semiconductor element.

Since the second insulating film having a lower dielectric constant than the first insulating film is disposed between the first wiring pattern and first insulting film, parasitic capacitance associated with the first wiring pattern can be reduced.

According to another aspect of the invention, there is provided a semiconductor device comprising: a semiconductor element formed over a surface of a semiconductor substrate; a protective film formed over the surface of the semiconductor substrate, the protective film covering the semiconductor element; a low dielectric constant film formed over the protective film, the low dielectric constant film having a dielectric constant lower than a dielectric constant of the protective film and made of porous silica or organic insulating material; a first wiring pattern formed over the low dielectric constant film; and a conductive connection member buried in the low dielectric constant film and the protective film, the conductive connection member electrically interconnecting the first wiring pattern and the semiconductor element.

According to still another aspect of the invention, there is provided a method of manufacturing a semiconductor device comprising steps of: (a) forming a semiconductor element over a surface of a semiconductor substrate; (b) forming a protective film made of insulating material over the surface of the semiconductor substrate by a vapor deposition method, the protective film covering the semiconductor element; (c) forming a first insulating film over the protective film by a coating method, the first insulating film being made of insulating material having a lower dielectric constant than the protective film; (d) forming a via hole through the first insulating film and the protective film; (e) burying a conductive plug in the via hole; and (f) forming a metal wiring pattern over the first insulating film, the metal wiring pattern being connected to the conductive plug.

Since the protective film formed by a vapor deposition method covers the semiconductor element, it is possible to suppress a variation in the electric characteristics of the semiconductor element, which variation appears if the semiconductor element directly contacts a film made of low dielectric constant material such as porous silica or organic insulating material formed by a coating method. Since the low dielectric constant film is disposed below the first wiring pattern (metal wiring pattern), parasitic capacitance associated with the first wiring pattern can be reduced.

DESCRIPTION OF THE PREFERRED EMBODIMENTS

Figure 1:
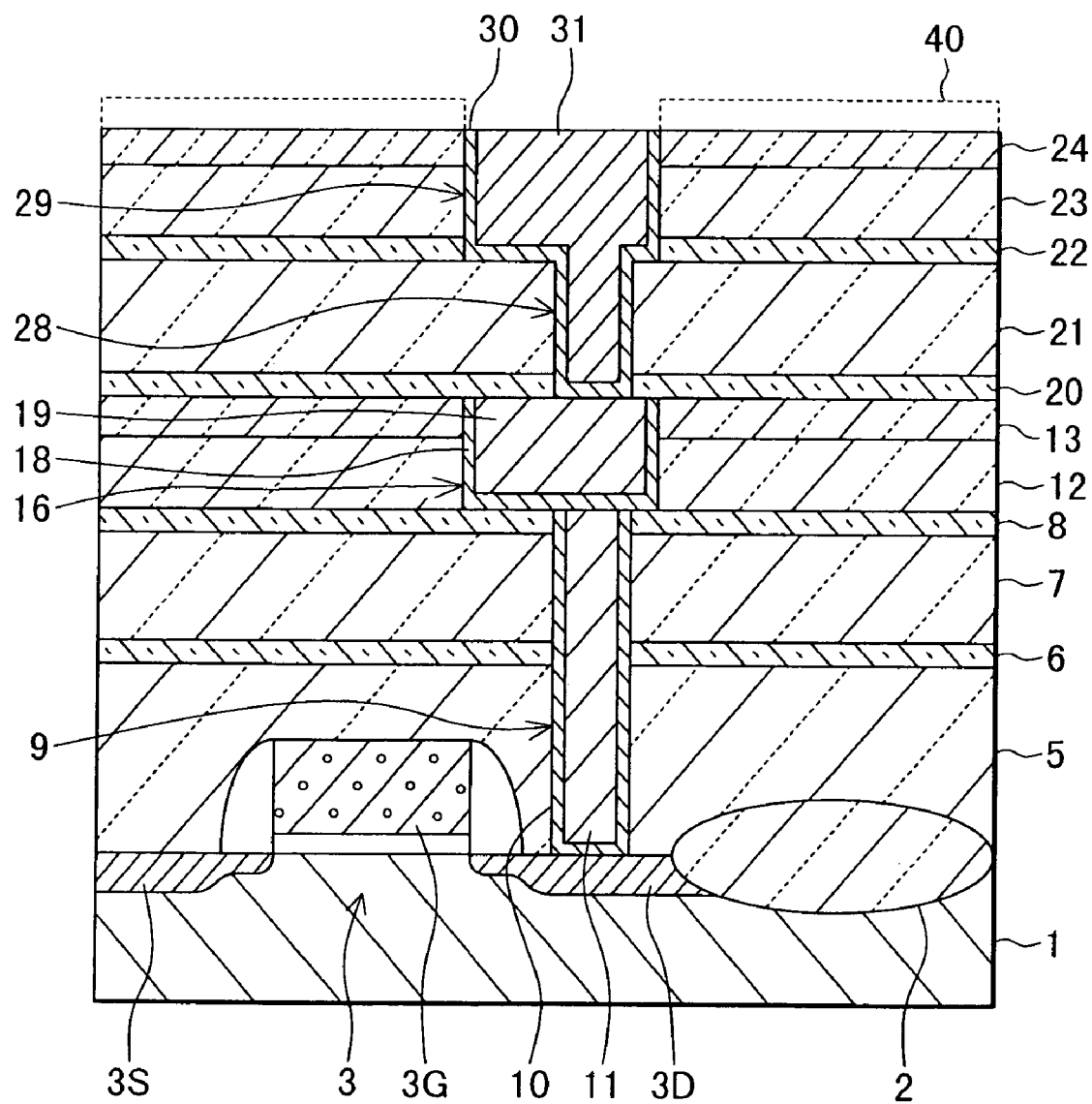
FIG. 1 is a cross sectional view of a semiconductor device according to a first embodiment.

FIG. 1 is a cross sectional view of a semiconductor device according to a first embodiment of the invention. On the surface of a semiconductor substrate 1 made of silicon, an element separation insulating film 2 is formed by local oxidation of silicon (LOCOS) or shallow trench isolation (STI). Active regions are defined by the element separation insulating film 2. On the surface of the active region, a MOSFET 3 is formed. MOSFET 3 comprises a source region 3S and a drain region 3D formed in a surface layer of the semiconductor substrate, and a gate electrode 3G formed on a gate insulating film between the source region 3S and drain region 3D.

Covering MOSFET 3, a via layer insulating film 5 of PSG is formed on the semiconductor substrate 1. The via layer insulating film 5 is formed by depositing a PSG film having a thickness of 1.5 μm by CVD and thereafter planarizing the surface of the PSG film. On the planarized via layer insulating film 5, a protective film 6 is formed having a thickness of 50 nm and made of silicon nitride. For example, the protective film 6 is formed by CVD.

On the protective film 6, a via layer insulating film 7 is formed having a thickness of 250 nm and made of porous silica. The via layer insulating film 7 is formed by spin-coating porous silica raw material (IPS) manufactured by CATALYSTS & CHEMICALS IND. CO., LTD. and thereafter performing baking and curing.

On the via layer insulating film 7, a cap film 8 is formed having a thickness of 100 nm and made of silicon nitride. For example, the cap film 8 is formed by CVD.

A via hole 9 is formed extending from the upper surface of the cap film 8 to the surface of the drain region 3D. The bottom and inner wall of the via hole 9 are covered with a barrier metal layer 10 of TiN. A conductive plug 11 made of tungsten is buried in the via hole 9. The barrier metal layer 10 and conductive plug 11 are formed by depositing a TiN film and a tungsten film and removing unnecessary TiN and tungsten films.

The TiN film can be formed by CVD using, for example, titanium chloride and ammonium as source gas at a substrate temperature of 500° C., preferably 450° C. or lower. The TiN film may be formed by sputtering. The tungsten film can be formed by CVD using tungsten hexafluoride and silane as source gas at a substrate temperature of 500° C., preferably 450° C. or lower.

On the cap film 8, a wiring layer insulating film 12 is formed having a thickness of 150 nm and made of porous silica. On the wiring layer insulating film 12, a cap film 13 is formed having a thickness of 100 nm and made of silicon oxide. A wiring trench 16 is formed through the wiring layer insulating film 12 and cap film 13. The wiring trench 16 can be formed by general photolithography and etching. The upper surface of the conductive plug 11 is exposed on the bottom of the wiring trench 16.

The bottom and inner wall of the wiring trench 16 are covered with a barrier metal layer 18 having a thickness of 30 nm and made of TaN. A first-layer copper wiring pattern 19 is buried in the wiring trench 16. The barrier metal layer 18 and copper wiring pattern 19 are formed by forming a TaN film and a copper film by sputtering, electroplating copper and thereafter removing unnecessary TaN and copper films.

An etching stopper film 20 of silicon nitride having a thickness of 50 nm, a second-layer via layer insulating film 21 of porous silica having a thickness of 250 nm, an etching stopper film 22 of silicon nitride, a second-layer wiring layer insulating film 23 of porous silica having a thickness of 150 nm and a cap film 24 of silicon oxide having a thickness of 100 nm are stacked in this order on the cap film 13 and first-layer copper wiring pattern 19.

A wiring trench 29 is formed extending from the upper surface of the cap film 24 to the upper surface of the etching stopper film 22. A via hole 28 is formed extending from the bottom of the wiring trench 29 to the upper surface of the first-layer wiring pattern 19. The bottoms and inner walls of the via hole 28 and wiring trench 29 are covered with a barrier metal layer 30 of TaN. A second-layer copper wiring pattern 31 is buried in the via hole 28 and wiring trench 29.

A method of forming the second-layer wiring pattern will be described. The etching stopper films 20 and 22 and cap film 24 are formed by CVD. The via layer insulating film 21 and wiring layer insulating film 23 are formed by a method similar to the method of forming the first-layer via layer insulating film 7.

After the lamination structure up to the cap film 24 is formed, a hard mask layer 40 having a thickness of 50 nm and made of silicon nitride is formed on the cap film 24. An opening corresponding to the wiring trench 29 is formed through the hard mask layer 40. A resist film is formed covering the hard mask layer 40. An opening corresponding to the via hole 28 is formed through the resist film. By using this resist film as a mask, a through hole is formed by etching the region from the cap film 24 to the bottom of the etching stopper film 22.

After the resist mask is removed, by using the hard mask layer 40 as a mask, the cap film 24 and wiring layer insulating film 23 are etched to form the wiring trench 29. At the same time, the via layer insulating film 21 is also etched so that the via hole 28 is formed. The etching stopper film 20 is exposed on the bottom of the via hole 28. The exposed etching stopper film 20 is removed to expose the lower level wiring pattern 19 on the bottom of the via hole 28. At this time, the hard mask layer 40 is also removed.

The inner walls of the via hole 28 and wiring trench 29 and the upper surface of the cap film 24 are covered with a TaN film having a thickness of 30 nm. The surface of the TaN film is covered with a copper seed layer having a thickness of 30 nm. Copper is electroplated to bury copper in the wiring trench 29 and via hole 28. Unnecessary copper and TaN films are removed by CMP. The barrier metal layer 30 and second-layer copper wiring pattern 31 are therefore left in the wiring trench 29 and via hole 28.

Wiring patterns of the third-layer and higher level layers can be formed by a similar method.

In the first embodiment described above, the two via layer insulating films are formed between the semiconductor substrate 1 and first-layer wiring pattern 19. The dielectric constant of the upper via layer insulating film 7 is lower than that of the lower via layer insulating film 5. Therefore, if the first-layer wiring pattern has a plurality of wiring lines, parasitic capacitance between wiring lines can be reduced.

Comb-tooth type electrodes meshing with each other were formed as the first-layer wiring pattern and electrostatic capacitance therebetween was measured. The electrostatic capacitance per 1 mm of the comb-tooth type electrode was almost equal to that of a comb-tooth type electrode formed as the second-layer wiring pattern, and the capacitance was 180 fF/mm. In contrast, the electrostatic capacitance was 220 fF/mm when the via-layer insulating film below the first-layer wiring pattern was made of PSG. With the structure of the first embodiment, parasitic capacitance between wiring lines can be reduced.

The first-layer wiring pattern 19 is disposed in the lowest level layer among the layers of metal wiring patterns. The lowest level wiring pattern is often disposed at a narrower pitch than the upper level wiring pattern. Parasitic capacitance between wiring lines of the first-layer wiring pattern is therefore larger than the upper level wiring pattern. Reduction in parasitic capacitance between wiring lines of the first-layer wiring pattern is particularly effective for the high speed operation of the semiconductor device.

In the first embodiment, the via layer insulating film 5 covering MOSFET 3 is made of PSG deposited by CVD. A variation in the electric characteristics of MOSFET 3 can therefore be prevented, which variation appears if MOSFET 3 directly contacts a film made of low dielectric constant material and formed by coating.

In the first embodiment, although porous silica is used as the low dielectric constant material, other low dielectric constant materials may be used which have a dielectric constant lower than that of silicon oxide, PSG, and BPSG. For example, organic insulating material such as SiLK (registered tradmark) of the Dow Chemical Company may be used.

In the first embodiment, although the first-layer wiring pattern 19 is formed by a single damascene method, the first-layer wiring pattern may be formed in the lamination structure from the protective film 6 to the cap film 13 by a dual damascene method, similar to the second-layer wiring pattern 31.

Figure 2:
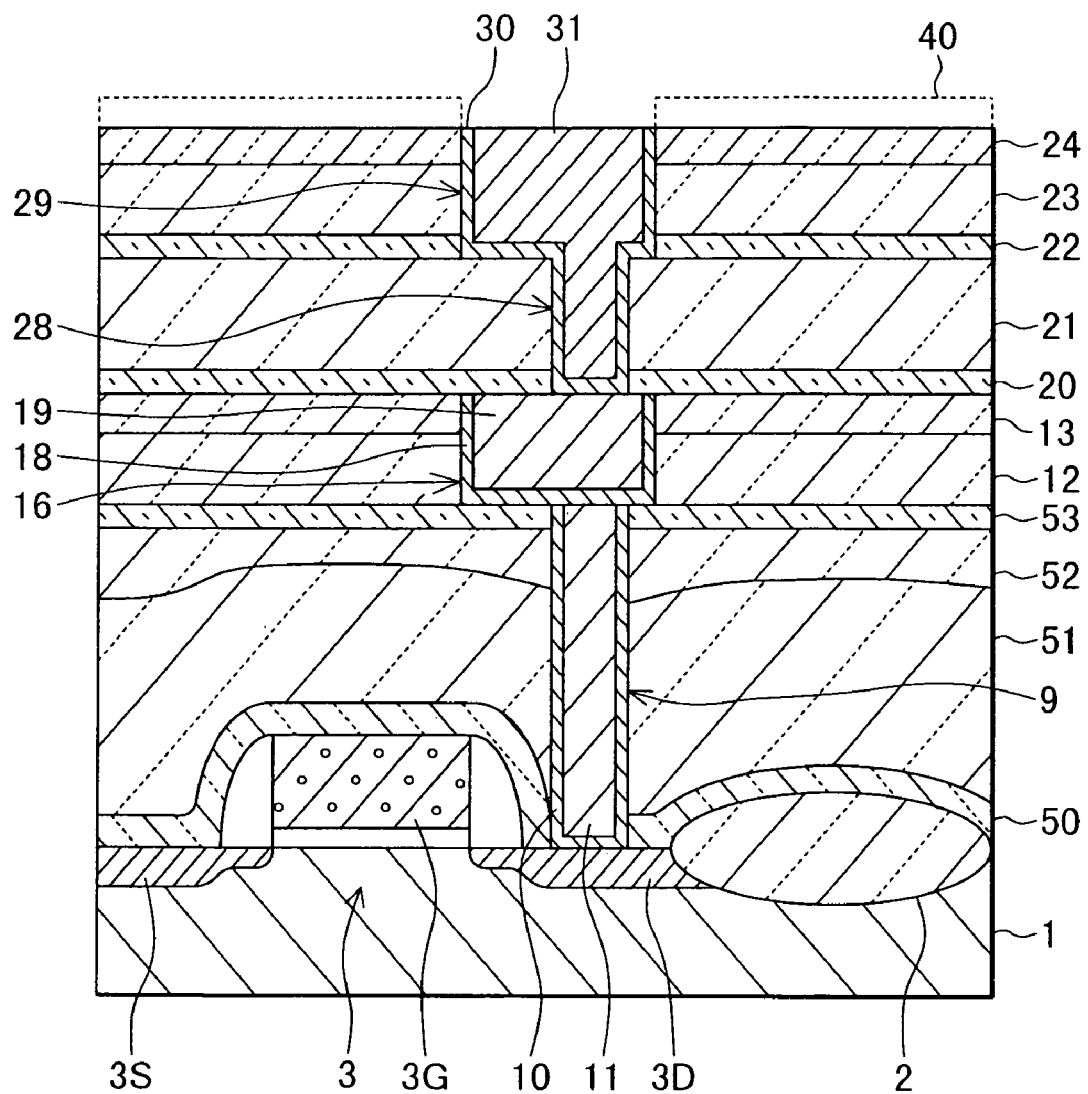
FIG. 2 is a cross sectional view of a semiconductor device according to a second embodiment.

FIG. 2 is a cross sectional view of a semiconductor device according to a second embodiment. As compared to the semiconductor device of the first embodiment shown in FIG. 1, the lamination structure from the first-layer via layer insulating film 5 to the cap film 8 of the first embodiment is replaced with a lamination structure of a protective film 50, a lower via layer insulating film 51, an upper via layer insulating film 52 and an etching stopper film 53 stacked in this order. The other structures are the same as those of the semiconductor device of the first embodiment.

The protective film 50 is made of silicon nitride and is 100 nm thick. The lower via layer insulating film 51 is formed by spin-coating poly-allyl-ether (e.g., SiLK manufactured by the Dow Chemical Company) to a thickness of about 1.0 μm and thereafter performing baking and curing. The largest step on the surface below the via layer insulating film 51 was about 1.5 μm, and the largest step on the surface of the via layer insulating film 51 was lowered to about 0.2 μm.

The upper via layer insulating film 52 is formed by depositing a silicon oxide film having a thickness of 0.5 μm by CVD and thereafter removing the surface layer by about 0.2 μm by CMP to planarize the surface thereof. The etching stopper film 53 is made of silicon nitride and is 50 nm thick.

A via hole 9 is formed extending from the upper surface of the etching stopper film 53 to the drain region 3D. The inner wall of the via hole 9 is covered with a barrier metal layer 10 and a conductive plug 11 made of tungsten is buried in the via hole 9.

Similar to the first embodiment, also in the second embodiment, the via layer insulating film 51 having a low dielectric constant is disposed between the semiconductor substrate 1 and first-layer wiring pattern 19. Parasitic capacitance associated with the first-layer wiring pattern can therefore be reduced. Comb-tooth type electrodes meshing with each other were formed as the first-layer wiring pattern. The electrostatic capacitance per 1 mm of the comb-tooth type electrode was 210 fF/mm. In contrast, the electrostatic capacitance was 240 fF/mm when the via-layer insulating film below the first-layer wiring pattern was made of PSG. It can be understood that the parasitic capacitance reduction effects can be obtained by adopting low dielectric constant material.

In the second embodiment, although the via layer insulating film 51 is made of low dielectric organic insulating material (SiLK), it may be made of porous silica.

Figure 3:
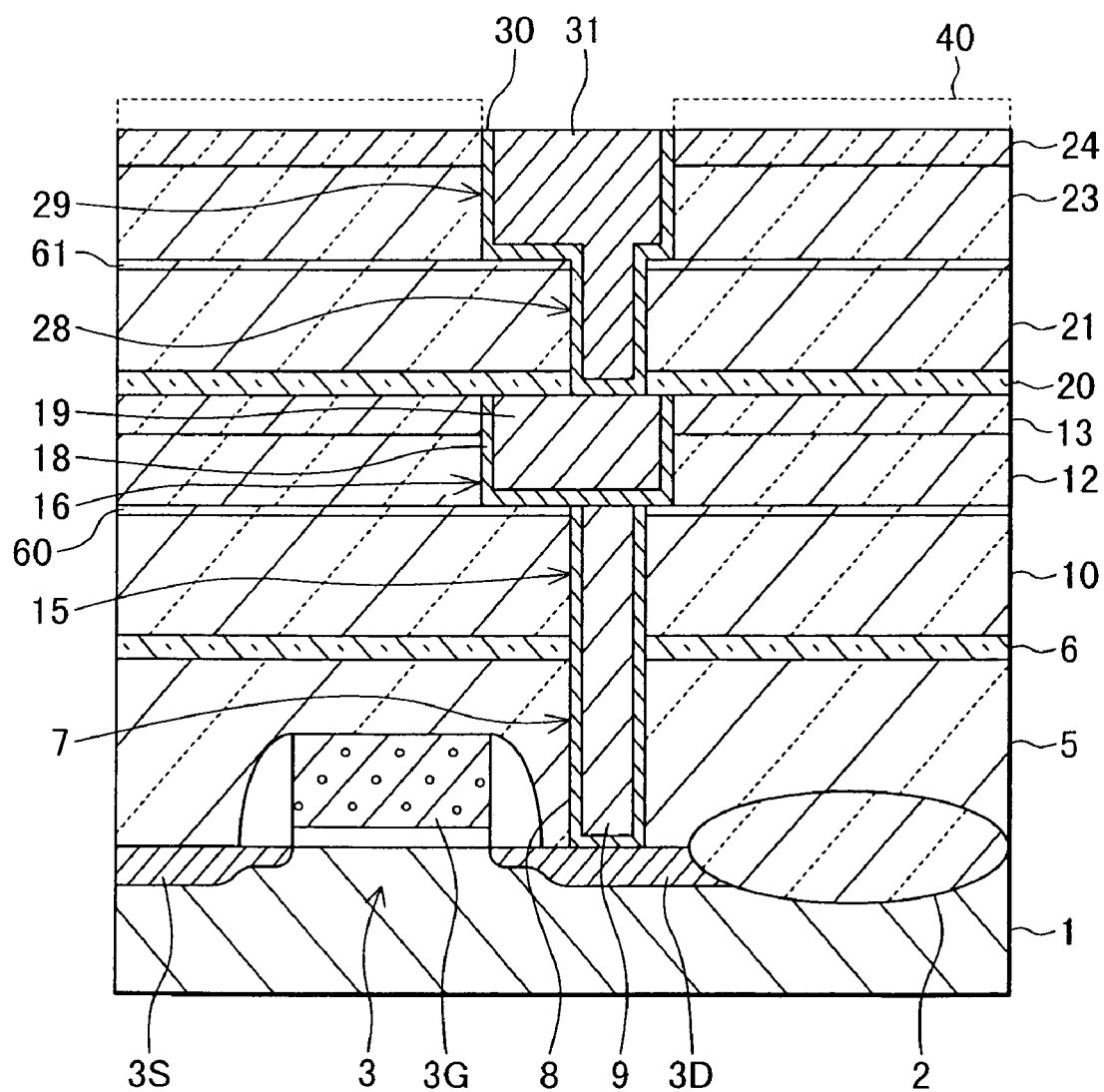
FIG. 3 is a cross sectional view of a semiconductor device according to a third embodiment.
Figure 4:
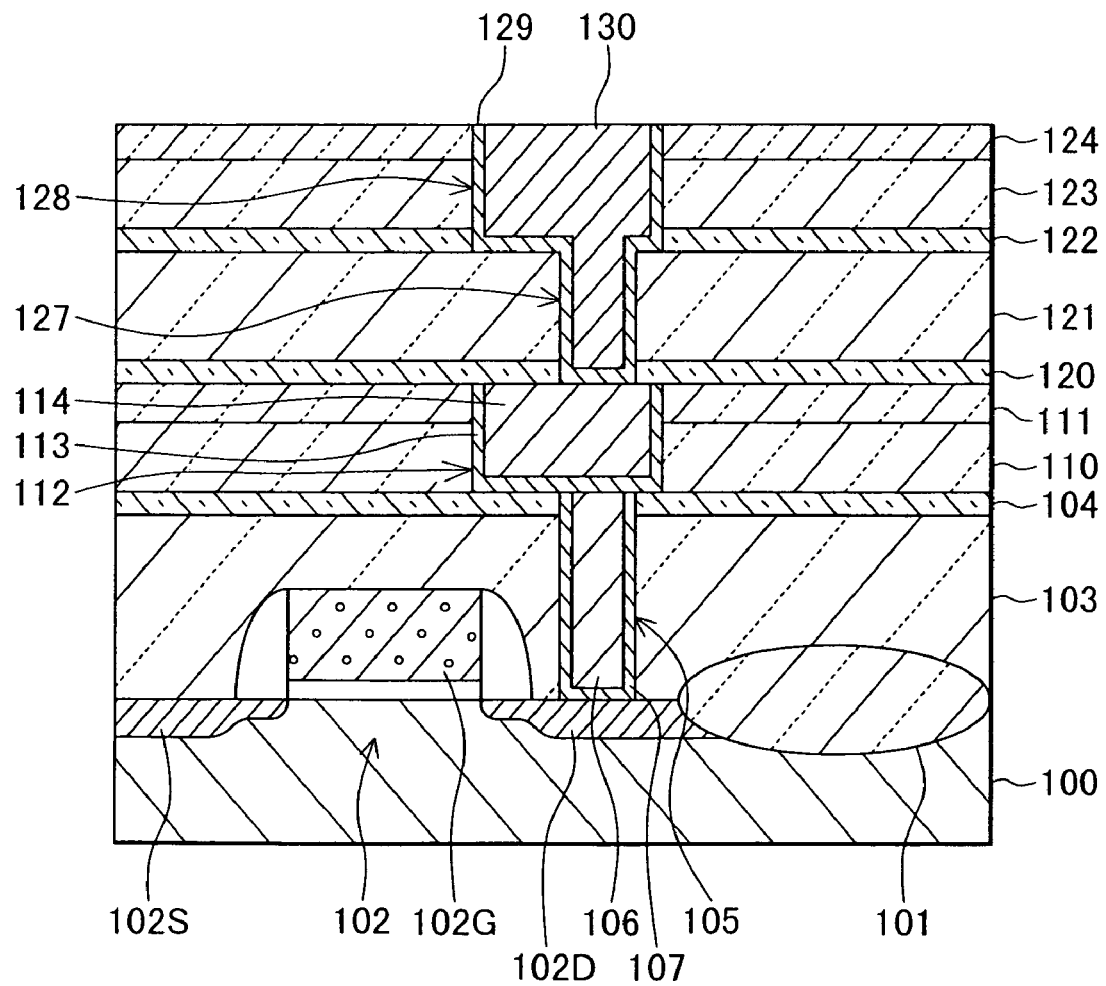
FIG. 4 is a cross sectional view of a conventional semiconductor device.

FIG. 3 is a cross sectional view of a semiconductor device according to a third embodiment. In the semiconductor device of the third embodiment, the etching stopper films 8 and 22 made of silicon nitride of the semiconductor device of the first embodiment shown in FIG. 1 are not formed and the via layer insulating films 10 and 21 are made of low dielectric constant insulating material such as poly-allyl-ether (e.g., SiLK manufactured by the Dow Chemical Company). On the upper surfaces of the via layer insulating films 10 and 21, very thin surface modifying layers 60 and 61 made of mainly silicon oxide are disposed. The surface modifying layer is made by processing organic insulating material with silane coupler or metal coupler.

Next, a surface processing method using silane coupler will be described. After the via layer insulating film 10 or 21 made of organic insulating material is formed, the surface of the via layer insulating film is exposed to oxygen plasma for 2 seconds. Thereafter, the surface is processed with silane coupler (e.g., hexamethyldisilazane). Then, heat treatment is performed for 3 minutes at a temperature of 300° C.

By utilizing an etching speed difference between the surface modifying layer and organic insulating material, the silicon oxide films 60 and 61 can be used as etching stopper films when the respective wiring trenches 16 and 29 are formed.

Similar to the first embodiment, also in the third embodiment, the via layer insulating film 10 having a low dielectric constant is disposed between the semiconductor substrate 1 and first-layer wiring pattern 19. Parasitic capacitance associated with the first-layer wiring pattern can therefore be reduced. Comb-tooth type electrodes meshing with each other were formed as the first-layer wiring pattern and second-layer wiring pattern. The electrostatic capacitance per 1 mm of the comb-tooth type electrode of both the patterns was 180 fF/mm.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device comprising steps of:
    (a) forming a semiconductor element on a surface of a semiconductor substrate;
    (b) forming a first insulating film made of insulating material directly on the surface of the semiconductor substrate by a vapor deposition method, the first insulating film covering the semiconductor element;
    (b1) planarizing a surface of the first insulating film;
    (c) forming a second insulating film over the first insulating film by a coating method, the second insulating film being made of insulating material having a lower dielectric constant than the first insulating film;
    (d) forming a via hole through the second insulating film and the first insulating film;
    (e) burying a conductive plug in the via hole:
    (f) forming a first wiring pattern over the second insulating film, the first wiring pattern being connected to the conductive plug; and
    (g) forming multilevel wiring patterns over the first wiring pattern,
    wherein the first wiring pattern and the multilevel wiring patterns are made of metal, and the first wiring pattern is disposed in a lowest level among wiring patterns made of metal.

2. The method of manufacturing the semiconductor device according to claim 1, wherein in said step (b1), the surface of the first insulating film is planarized by chemical mechanical polishing.

3. The method of manufacturing the semiconductor device according to claim 1, wherein the second insulating film is made of porous silica or organic insulating material.

4. The method of manufacturing the semiconductor device according to claim 1, further comprising, after step (c), the step of processing the second insulating film with silane couple or metal coupler to form a surface modifying layer on the second insulating film.

5. The method of manufacturing the semiconductor device according to claim 1, further comprising, between said step (b1) and said step (c), the step of forming a protective film on the first insulating film.

6. The method of manufacturing the semiconductor device according to claim 5, wherein the protective film is made of silicon nitride.

* * * * *